United States Patent
Cruz et al.

(10) Patent No.: US 12,036,607 B2
(45) Date of Patent: Jul. 16, 2024

(54) METHOD AND SYSTEM FOR MANUFACTURING NANOPOROUS STRUCTURES ON A SUBSTRATE

(71) Applicants: Alexander John Cruz, Mechelen (BE); Navin Sakthivel, Spring, TX (US)

(72) Inventors: Alexander John Cruz, Mechelen (BE); Navin Sakthivel, Spring, TX (US)

(73) Assignee: BAKER HUGHES OILFIELD OPERATIONS LLC, Houston, TX (US)

(*) Notice: Subject to any disclaimer, the term of this patent is extended or adjusted under 35 U.S.C. 154(b) by 24 days.

(21) Appl. No.: 17/702,337

(22) Filed: Mar. 23, 2022

(65) Prior Publication Data
US 2023/0311213 A1  Oct. 5, 2023

(51) Int. Cl.
| | |
|---|---|
| B22F 10/62 | (2021.01) |
| B22F 10/68 | (2021.01) |
| B28B 1/00 | (2006.01) |
| B28B 11/00 | (2006.01) |
| B33Y 10/00 | (2015.01) |
| B33Y 30/00 | (2015.01) |
| B33Y 40/20 | (2020.01) |

(52) U.S. Cl.
CPC .............. *B22F 10/62* (2021.01); *B22F 10/68* (2021.01); *B28B 1/001* (2013.01); *B28B 11/00* (2013.01); *B33Y 10/00* (2014.12); *B33Y 30/00* (2014.12); *B33Y 40/20* (2020.01); *B22F 2301/205* (2013.01)

(58) Field of Classification Search
CPC ......... B33Y 30/00; B33Y 40/00; B33Y 40/10; B33Y 40/20; B33Y 10/00; B22F 12/70; B22F 10/62; B22F 10/68; B22F 2301/205; B22F 3/1143; B22F 3/14; B28B 1/001; B28B 11/00; C23C 16/045; C23C 16/40
See application file for complete search history.

(56) References Cited

U.S. PATENT DOCUMENTS

| | | | |
|---|---|---|---|
| 7,108,894 | B2 | 9/2006 | Renn |
| 7,938,341 | B2 | 5/2011 | King et al. |

(Continued)

FOREIGN PATENT DOCUMENTS

| | | |
|---|---|---|
| CN | 110607515 A | 12/2019 |
| EP | 3137647 B1 | 12/2019 |
| KR | 102129821 B1 | 7/2020 |

(Continued)

OTHER PUBLICATIONS

Stassen et al. ("Vapor-Phase Deposition and Modification of Metal-Organic Frameworks: State-of-the-Art and Future Directions." Chemistry—A European Journal 22.41 (2016): 14452-14460.) (Year: 2016).*

(Continued)

*Primary Examiner* — Samir Shah
*Assistant Examiner* — Ricardo D Morales
(74) *Attorney, Agent, or Firm* — CANTOR COLBURN LLP

(57) ABSTRACT

A method of manufacturing a nanoporous structure on a substrate includes: additively forming a precursor structure from at least one of a metal oxide or a metal cluster compound on a substrate; exposing the precursor structure to a vapor of an organic linker; and reacting the at least one of the metal oxide or the metal cluster compound in the precursor structure with the organic linker to form the nanoporous structure comprising a metal-organic framework.

25 Claims, 2 Drawing Sheets

(56) References Cited

U.S. PATENT DOCUMENTS

| | | | |
|---|---|---|---|
| 10,685,833 | B2 | 6/2020 | Krishtab et al. |
| 10,767,263 | B2 | 9/2020 | Stassen et al. |
| 2017/0072463 | A1* | 3/2017 | Ng .......................... B29C 70/00 |
| 2017/0252829 | A1* | 9/2017 | Sachs ..................... B33Y 50/02 |
| 2018/0369912 | A1 | 12/2018 | Gold |
| 2021/0193458 | A1 | 6/2021 | Salmi et al. |

FOREIGN PATENT DOCUMENTS

| | | |
|---|---|---|
| WO | 2015166015 A1 | 11/2015 |
| WO | WO-2021255467 A1 * | 12/2021 |

OTHER PUBLICATIONS

Cruz et al., "An integrated cleanroom process for the vapor-phase deposition of large-area zeolitic imidazolate framework thin films"; 2019, 22 pages.

Department of Energy (DOE), Office of Energy Efficiency and Renewable Energy (EERE),FY21 Advanced Manufacturing Office Multi-Topic FOA, Funding Opportunity Announcement (FOA) No. DE-FOA-0002553, issued Jul. 29, 2021, 100 pages.

Stassen et al., "Chemical vapour deposition of zeolitic imidazolate framework this films"; Nature Materials, vol. 15, Dec. 14, 2015; 9 pages.

International Search Report for International Application No. PCT/US2023/015511, International Filing Date Mar. 17, 2023, Date of Mailing Jul. 17, 2023, 3 pages.

Written Opinion for International Application No. PCT/US2023/015511, International Filing Date Mar. 17, 2023, Date of Mailing Jul. 17, 2023, 6 pages.

Stassen et al., Vapor-Phase Deposition and Modification of Metal-Organic Frameworks: State-of-the-Art and Future Directions, Chemistry A European Journal, vol. 22, Issue 41, Oct. 4, 2016, pp. 14452-14460.

* cited by examiner

METHOD AND SYSTEM FOR MANUFACTURING NANOPOROUS STRUCTURES ON A SUBSTRATE

BACKGROUND

Nanoporous coatings have been used in carbon capture and utilization applications. Currently, these nanoporous coatings are manufactured via solvent-based and bulk preparation methods, where the coating precursors are heated in a solvent to form a coating composition, and then the coating composition is poured onto the substrate to be coated to form the nanoporous coating after drying out the solvent. In these methods, there is very limited control over the deposition of the coating in terms of thickness, spatial distribution, and composition. In addition, these methods can lead to the corrosion or degradation of the substrate to be coated. Accordingly, there is a continuing need for an improved method and system for manufacturing nanoporous structures such as coatings or articles on substrates for carbon capture and utilization applications.

SUMMARY

A method of manufacturing a nanoporous structure on a substrate includes: additively forming a precursor structure from at least a metal oxide or a metal cluster compound on a substrate; exposing the precursor structure to a vapor of an organic linker; and reacting the at least one of the metal oxide or the metal cluster compound in the precursor structure with the organic linker to form the nanoporous structure comprising a metal-organic framework.

An integrated system for manufacturing a nanoporous structure on a substrate includes: a reactor chamber equipped with a heater effective to heat the reactor chamber and a substrate disposed in the rector chamber, the reactor chamber having an inlet for introducing a vapor of an organic linker into the reactor chamber and an outlet for removing a gaseous stream from the reactor chamber; a platform disposed inside the reactor chamber, the platform being effective to support and heat the substrate; and an additive manufacturing apparatus disposed inside the reactor chamber, the additive manufacturing apparatus effective to additively forming a precursor structure on the substrate.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed method and system presented herein by way of exemplification and not limitation with reference to the Figures.

A method of manufacturing a nanoporous structure on a substrate is described. As used herein, a nanoporous structure includes but is not limited to a nanoporous coating. The method comprises additively forming a precursor structure on a substrate, followed by converting the precursor structure to a nanoporous structure via a chemical vapor transformation process, achieved by exposing the precursor structure to an organic linker vapor. The method avoids the limitations associated with the conventional solvent-based methods such as corrosion, contamination, and lack of control over the deposition process, i.e., thickness, spatial distribution, and composition across the substrate and through the stratum. Moreover, the method can be carried out in an integrated system that incorporates additive deposition and chemical vapor processing in a single chamber, resulting in increased throughput, i.e., lead-time savings. Further the nanoporous structure made by the method can have finely-controlled dimension, composition, and properties down to the nanometer and sub-nanometer scales. As these properties can be controlled, the nanoporous structure can be used for a targeted flue gas stream, i.e., concentration, gas mixtures, for carbon capture and utilization applications.

Figure 1:
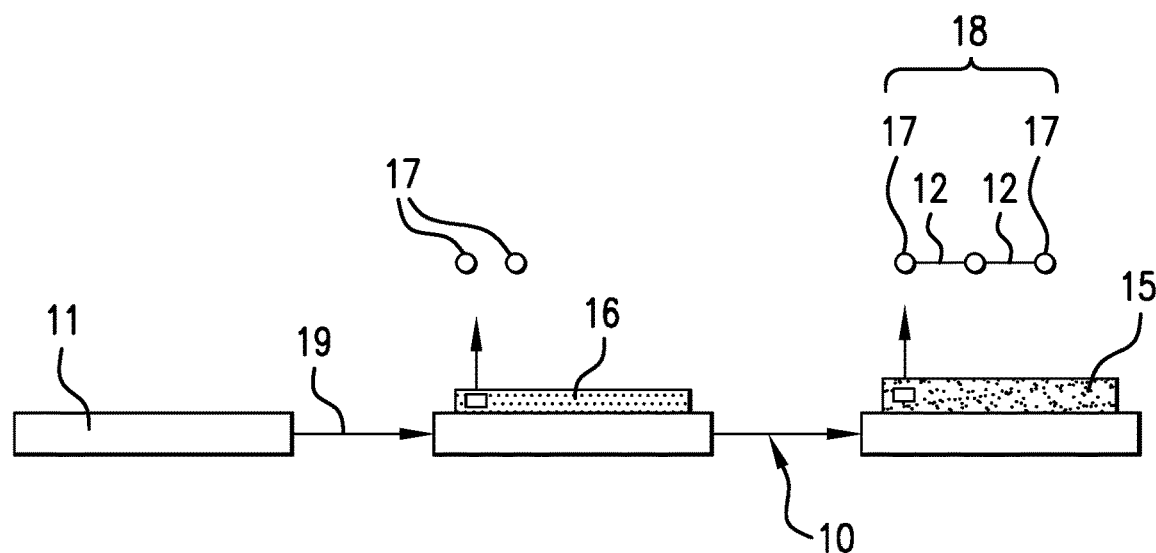
FIG. 1 illustrates a process of manufacturing a nanoporous structure on a substrate according to an embodiment of the disclosure.
Figure 3:
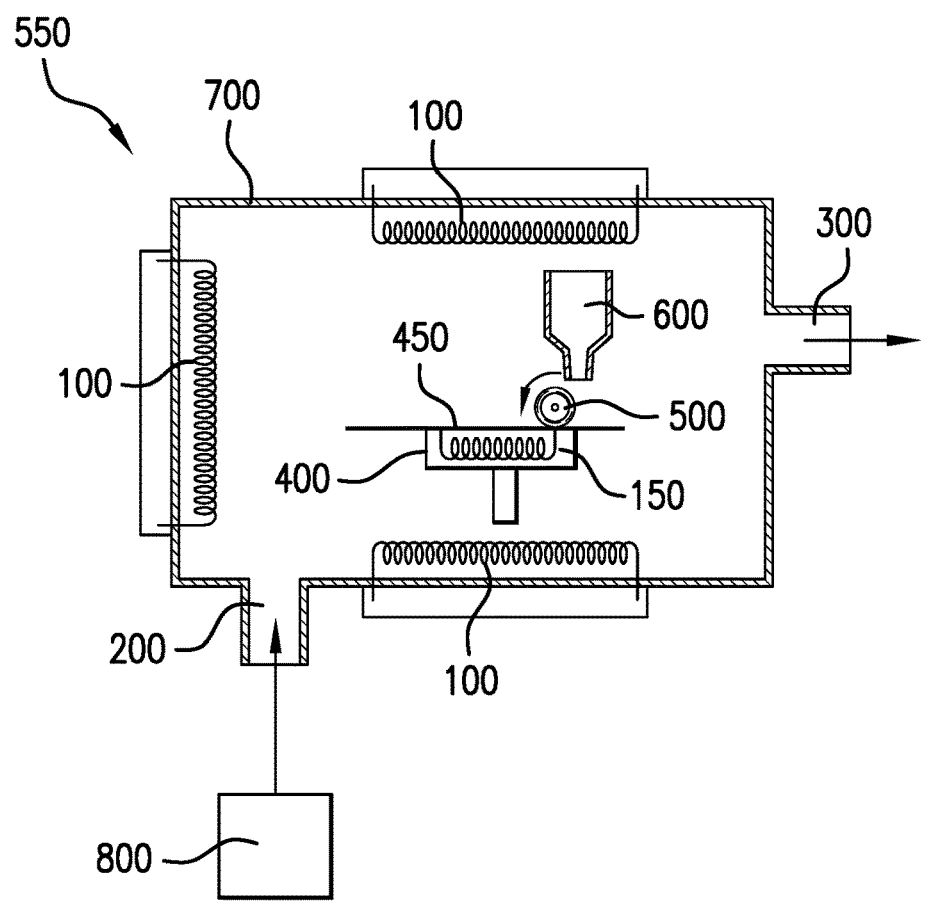
FIG. 3 is a schematic view of an integrated system for manufacturing a nanoporous structure on a substrate according to an embodiment of the disclosure.

Referring to FIG. 1, a method of manufacturing a nanoporous structure (15) on a substrate (11) comprises: additively forming (19) a precursor structure (16) from at least one of a metal oxide or a metal cluster compound on a substrate (11); exposing the precursor structure (16) to a vapor of an organic linker (10); and reacting the at least one of the metal oxide or the metal cluster compound in the precursor structure (16) with the organic linker (10) to form the nanoporous structure (15) comprising a metal-organic framework (18). The method can further include generating and delivering the vapor of the organic linker (10) to the precursor structure (16). Preferably the vapor of the organic linker (10) is generated in a separate system from where the vapor is contacted with the precursor structure so that the temperature to generate the vapor and the temperature to react the organic linker with the metal oxide or the metal cluster compound can be individually controlled.

The metal oxide used to make the precursor structure can comprise at least one of zinc oxide, aluminum oxide, magnesium oxide, iron oxide, cobalt oxide, nickel oxide, copper oxide, calcium oxide, barium oxide, cerium oxide, manganese oxide, gallium oxide, or cadmium oxide. The metal cluster compound used to make the precursor structure can comprise at least one of a titanium-based cluster compound or a zirconium-based cluster compound. As used herein, a titanium-based cluster compound or a zirconium-based cluster compound refers to a cluster compound that contains titanium or zirconium as the main metal.

The metal oxide and the metal cluster compound can be in a particulate form. The particle sizes of the metal oxide and the metal cluster compound are not particularly limited. Advantageously, the metal oxide and the metal cluster compound can have an average particle size of about 10 nanometers (nm) to about 100 micrometers (lam), preferably about 10 nm to about 10 μm, about 10 nm to about 1 μm, or about 10 nm to about 500 nm. The average particle size of the metal oxide and the metal cluster compound is, for example, a median diameter (D50) measured using a laser particle size distribution meter.

The substrate that the nanoporous structure is disposed on is not particularly limited, and can include metallic substrates, ceramic substrates, polymeric substrates, or composite substrates. The substrate selected will depend on the nature of the carbon capture and utilization system targeted.

In the method disclosed herein, the precursor structure is additively formed on the substrate from at least one of the metal oxide or the metal cluster compound. By using additively manufacturing, the precursor structure can be engineered based on the optimized flow in consideration of the targeted (flue) gas characteristics, e.g., for carbon dioxide capture and utilization applications. Additively forming the precursor structure can be conducted via an aerosol jetting process, a binder jetting process, or a material jetting process.

When an aerosol jetting process is used to make the precursor structure, a composition comprising at least one of the metal oxide or the metal cluster compound and optionally a solvent is loaded in an aerosol jetting apparatus, and then the metal oxide/metal cluster compound is atomized using either ultrasonic or pneumatic processes. The atomized metal oxide or metal cluster compound in the composition can then be picked up by an inert carrier gas to form an aerosol. The aerosol can be conducted to a nozzle, where the aerosol is focused and collimated as it exits the nozzle. The focused aerosol stream is directed toward the substrate to be coated such that the atomized metal oxide or metal cluster compound is deposited on the substrate. The deposited metal oxide or metal cluster compound can be annealed or sintered at a temperature of about 250 to about 2000° C., or about 450° C. to about 2000° C. and a pressure of about 1 millibar to about 1 bar to form the precursor structure.

An exemplary aerosol jetting apparatus which could be used is manufactured by Optomec, Inc, and is described, for example, in U.S. Pat. Nos. 7,108,894 and 7,938,341. Commercially available aerosol jetting apparatus includes Optomec AEROSOL JET 300 series systems.

The precursor structure can also be additively formed via a binder jetting process. During a binder jetting process, a layer of a powder comprising at least one of a metal oxide or a metal cluster compound is deposited on the substrate to be coated. Then a liquid binder is selectively sprayed to the powder layer according to a preset pattern. The liquid binder can comprise an organic binder and optional a solvent for the organic binder. After applied to the powder, the binder is solidified or dried. Additional powder and additional binder are deposited to form the next layer. The process is repeated under a green structure is formed. Thereafter the green structure is sintered to form the precursor structure. The sintering temperature can be from about 150 to about 2000° C., preferably from about 450 to about 2000° C. The sintering can be conducted at a pressure of about 1 millibar to about 1 bar. During sintering, the binder can be burned off.

The precursor structure can also be formed via a material jetting process. Material jetting can be referred to as continuous or drop-on-demand jetting. The metal oxide and the metal cluster compound jetted on the substrate to be coated can be sintered or annealed forming the precursor structure.

The precursor structure made by the method described herein can have a thickness of about 10 nm to about 10 microns, about 100 nm to about 1 micron, or about 800 nm to about 10 microns. As used herein, the thickness of the precursor structure can be measured at a direction perpendicular to the substrate. After the precursor structure is formed but before the precursor structure is exposed to an organic linker vapor, the precursor structure can optionally be depowdered to remove loose particles from a surface of the precursor structure.

Next, the precursor structure is exposed to a vapor of an organic linker. The organic linker can comprise at least one of a carboxylate or an imidazolate. Examples of the organic linker include 2-methylimidazolate, 2-ethylimidazolate, 1-benzyl-1H-imidazolate, benzene-1,4-dicarboxylate, trans-1,4-cyclohexanedicarboxylate, 1,3,5-benzenetricarboxylate, and benzene-1,2,4,5-tetracarboxylate. Other known organic linkers can also be used. More than one organic linker can be used. In an aspect, a vapor of two or more organic linkers are reacted with the at least one of the metal oxide or the metal cluster compound in the precursor structure to form the nanoporous structure (15) comprising a metal-organic framework (18).

The metal oxide or the metal cluster compound can react with the organic linker at a temperature of about 80° C. to about 185° C., preferably about 80° C. to about 100° C. and a pressure of about 0.001 bar to about 10 bar, preferably about 0.001 bar to about 1 bar to form the nanoporous structure comprising a metal-organic network.

After the reaction, the nanoporous structure can be activated by heating the nanoporous structure at a temperature of about 100 to about 200° C., preferably about 120° C. to about 150° C. at a subatmospheric pressure of about 0.0001 bar to about 0.01 bar, preferably about 0.0001 bar to about 0.001 bar. During activation, the excess organic linker that is deposited on the nanoporous structure, and inside the pores of the nanoporous structure but not reacted with the metal oxide or metal cluster compound may be removed.

The formed nanoporous structure can have a thickness of about 10 nm to about 500 nm, or about 1 μm to about 100 μm. The thickness of the nanoporous structure can be measured in a direction perpendicular to the substrate. The nanoporous structure comprises a metal-organic frame. In particular, the nanoporous structure has a crystalline network of solids comprising inorganic nodes (17) linked by organic moieties (12), wherein the inorganic nodes are formed from at least one of the metal oxide or the metal cluster compound, and the organic moieties are formed from the organic linker. The pore diameter of the potential voids in the crystalline network can be in a range of about 5 to about 20 Å, and the pore walls area is approximately a single-molecule thick. This crystalline lattice provides large internal specific surface areas (up to >~7000 m$^2$/g), and can be used in integrated and energy technology applications.

With the method disclosed herein, the localization, the shape, the thickness, and the composition of the nanoporous structure can be controlled, and these features cannot be achieved with the conventional solvent-based or bulk preparation methods.

Figure 2A:
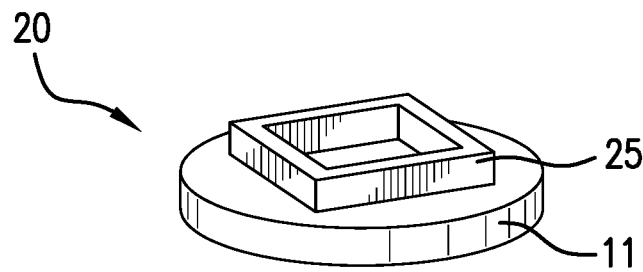
FIG. 2A illustrates an article comprising a nanoporous structure disposed on a substrate, wherein the nanoporous structure has a pattern.

Illustratively, a conventional method may produce a continuous film or structure on a substrate. The method as disclosed herein can not only produce a continuous coating but also a discontinuous nanoporous structure or a nanoporous structure having a predetermined pattern. FIG. 2A illustrates an article (20) comprising a nanoporous structure (25) disposed on a substrate (11) where the nanoporous structure (25) has a predetermined pattern. The pattern can be designed to achieve a "functional effect" for various applications. Such an article (20) can be manufactured by the method described herein but not with the conventional methods.

The nanoporous structure prepared in accordance with a method of the disclosure can have a first portion and a second portion, where the first portion and the second portion have at least one of a different thickness, a different shape, or a different metal-organic framework. As used herein, different metal-organic frameworks can include metal-organic frameworks with different organic linkers, metal-organic frameworks with different inorganic nodes, or metal-organic frameworks with different pore diameters, different pore walls areas, or different internal specific surface areas. Different metal-organic frameworks can have more than one differences.

Figure 2B:
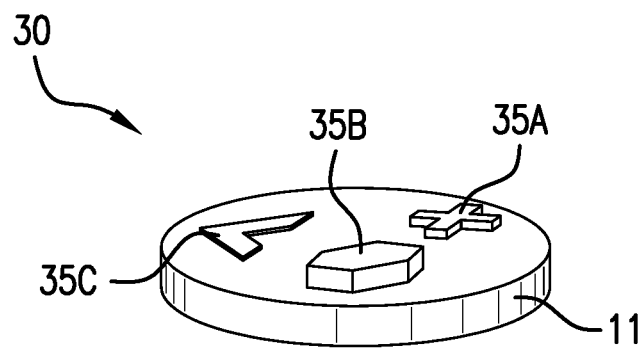
FIG. 2B illustrates an article comprising a nanoporous structure disposed on a substrate, wherein the nanoporous structure has several portions and these portions have at least one of a different shape, a different thickness, or a different metal-organic framework.

FIG. 2B illustrates an article (30) prepared in accordance with a method of the disclosure. The article (30) comprises a nanoporous structure disposed on a substrate (11) wherein the nanoporous structure comprises a first nanoporous structure (35A), a second structure (35B), and a third nanoporous structure (35C), wherein the first, second, and third nanoporous structures can have at least one of a different shape, a different thickness, or a different metal-organic framework.

The method as described herein also allows for the manufacture of nanoporous structures having a layered structure on a substrate, wherein at least two layers have at least one of a different thickness, a different shape, or a different metal-organic framework. For example, the nanoporous structure can be an AB-AB-AB stack for a binary system. The nanoporous structure can also be an ABC-ABC-ABC stack for a ternary system. Other configuration is also possible. Such an article can be advantageously used in a membrane separation process, carbon capture for a multi-component off-gas stream, or the like.

An article having a layered nanoporous structure on a substrate can be prepared by forming a first nanoporous structure on a substrate as described herein, additively forming a second precursor structure from at least one of a second metal oxide or a second metal cluster compound on the first nanoporous structure; exposing the second precursor structure to a vapor of a second organic linker; and reacting the at least one of the second metal oxide or the second metal cluster compound in the second precursor structure with the second organic linker to form a second nanoporous structure comprising a second metal-organic framework disposed on the first nanoporous structure. The process can be repeated to deposit more layers with controlled thickness and/or composition.

Alternatively, an article having a layered nanoporous structure on a substrate can be prepared by additively forming a first precursor layer on a substrate, additively forming a second precursor layer on the first precursor layer, and additively forming additional precursor layers if desired to provide a stack of precursor layers, where the metal oxides/metal cluster compounds used to make each precursor layer can be the same or different; exposing the stack of the precursor layers to a vapor of an organic linker, and reacting the metal oxides/metal cluster compounds in the precursor stack with the organic linker to form the article. Each layer of the nanoporous structure can have the same or different metal-organic framework.

Figure 2C:
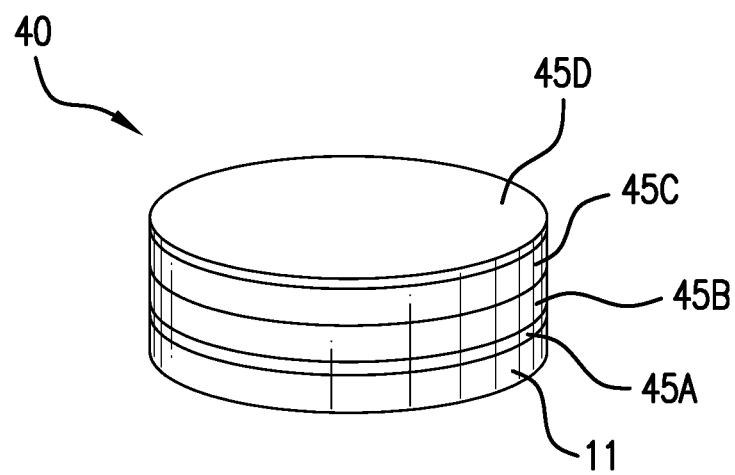
FIG. 2C illustrates an article comprising a nanoporous structure disposed on a substrate, wherein the nanoporous structure has multiple layers and the adjacent layers have at least one of a different thickness or a different metal-organic framework.

FIG. 2C illustrates an article (40) having a nanoporous structure disposed on a substrate (11), wherein the nanoporous structure has a first layer (45A), a second layer (45B), a third layer (45C), and a fourth layer (45D), wherein the adjacent layers of the nanoporous structure have at least one of a different thickness, a different shape, or a different metal-organic framework.

Advantageously, in the system for manufacturing the nanoporous nanostructure, a chemical vapor transformation system is integrated into an additive manufacturing system. Thus the precursor structure and the nanoporous structure can be formed in a single reactor chamber.

As a specific example, a method of manufacturing a nanoporous structure comprises additively forming a precursor structure on a substrate via an aerosol jetting process, a binder jetting process, or a material jetting process from at least one of a metal oxide or a metal cluster compound in a reactor chamber equipped with a heater; introducing a vapor of the organic linker and optionally together with a carrier gas into the reactor chamber; exposing the precursor structure to the vapor of the organic linker in the reactor chamber; reacting the at least one of the metal oxide or the metal cluster compound in the precursor structure with the organic linker in the reactor chamber at a temperature of about 80° C. to about 100° C. to form the nanoporous structure comprising the metal-organic framework; and heating the nanoporous structure at a temperature of about 120° C. to about 150° C. at a subatmospheric pressure of about 0.0001 bar to about 0.001 bar to activate the nanoporous structure.

Referring to FIG. 2, an integrated system (550) for manufacturing a nanoporous structure comprises a reactor chamber (700) equipped with a heater (100) effective to heat the reactor chamber (700). The heater (100) can also heat the substrate disposed in the reactor chamber (700). The integrated system can have more than one heaters to ensure that the interior of the reactor chamber is evenly heated. The heaters can be individually controlled. Accordingly each chamber wall can have a different temperature if desired. The configuration allows for further control over the additive formation process and chemical transformation kinetics.

The reactor chamber (700) can have an inlet (200) for introducing a vapor of an organic linker and optionally a carrier gas into the reactor chamber (700) and an outlet (300) for removing a gaseous stream from the reactor chamber (700). The vapor of the organic linker can be generated in a vapor generation system, for example, chamber 800, which is in fluid communication with the reactor chamber (700). The vapor generation system can have a heater (not shown). The temperature of the vapor generation system may be different from the temperature of the reactor chamber. The gaseous stream to be removed can include byproducts and the gaseous carrier if used. The outlet (300) of the reactor chamber (700) can be coupled to a pump.

The integrated system (550) also includes a platform (400) disposed inside the reactor chamber (700). The platform (400) can be movable and is effective to support a substrate (450) where the nanoporous structure is disposed on. Optionally, the movable platform (400) is also equipped with a heater (150). The platform can have more than one heaters to ensure that the substrate is evenly heated. The heater (150) allows the substrate to be heated to a temperature that is different from the chamber temperature. The additional heater (150) can permit further control over the additive formation process and chemical transformation kinetics.

The integrated system (550) can also include an additive manufacturing apparatus (600) disposed inside the reactor chamber (700). The additive manufacturing apparatus (600) is effective to additively forming a precursor structure on the substrate. Known additive manufacturing apparatus can be used and can include an aerosol jetting apparatus, a binder jetting apparatus, or a material jetting apparatus. Optionally the integrated system (550) also includes a roller (500) to spread the powder jetted onto the substrate to be coated.

Set forth below are some embodiments of the foregoing disclosure:

Embodiment 1. A method of manufacturing a nanoporous structure on a substrate, the method comprising: additively forming a precursor structure from at least one of a metal oxide or a metal cluster compound on a substrate; exposing the precursor structure to a vapor of an organic linker; and reacting the at least one of the metal oxide or the metal cluster compound in the precursor structure with the organic linker to form the nanoporous structure comprising a metal-organic framework.

Embodiment 2. The method as in any prior embodiment, comprising additively forming the precursor structure via an aerosol jetting process, a binder jetting process, or a material jetting process.

Embodiment 3. The method as in any prior embodiment, wherein the precursor structure is formed from the metal oxide, and the metal oxide comprises at least one of zinc oxide, aluminum oxide, magnesium oxide, iron oxide, cobalt oxide, nickel oxide, copper oxide, calcium oxide, barium oxide, cerium oxide, manganese oxide, gallium oxide, or cadmium oxide.

Embodiment 4. The method as in any prior embodiment, wherein the precursor structure is formed from the metal cluster compound, and the metal cluster compound comprises at least one of a titanium-based cluster compound or a zirconium-based cluster compound.

Embodiment 5. The method as in any prior embodiment, wherein the metal oxide and the metal cluster compound have a particle size of about 10 nm to about 100 μm.

Embodiment 6. The method as in any prior embodiment, wherein the precursor structure has a thickness of about 10 nm to about 10 microns.

Embodiment 7. The method as in any prior embodiment, further comprising depowdering the precursor structure to remove loose particles from the precursor structure before the precursor structure is exposed to the vapor of the organic linker.

Embodiment 8. The method as in any prior embodiment, wherein the organic linker comprises at least one of a carboxylate or a imidazolate.

Embodiment 9. The method as in any prior embodiment, comprising reacting the at least one of the metal oxide or the metal cluster compound in the precursor structure with the organic linker at a temperature of about 80° C. to about 100° C. to form the nanoporous structure.

Embodiment 10. The method as in any prior embodiment, comprising reacting the at least one of the metal oxide or the metal cluster compound in the precursor structure with the organic linker at a pressure of about 0.001 bar to about 1 bar to form the nanoporous structure.

Embodiment 11. The method as in any prior embodiment, wherein the additively forming, the exposing, and the reacting occur in a single reactor chamber.

Embodiment 12. The method as in any prior embodiment, wherein the metal-organic framework is a crystalline network comprising inorganic nodes linked by organic moieties, the inorganic nodes formed from the at least one of the metal oxide or the metal cluster compound, and the organic moieties formed from the organic linker; and the crystalline network has voids with a pore diameter of about 5 to about 20 angstroms.

Embodiment 13. The method as in any prior embodiment, further comprising exposing the nanoporous structure to a temperature of about 120° C. to about 150° C. at a subatmospheric pressure of about 0.0001 bar to about 0.001 bar to activate the nanoporous structure.

Embodiment 14. The method as in any prior embodiment, comprising: additively forming the precursor structure on the substrate via an aerosol jetting process, a binder jetting process, or a material jetting process from at least one of the metal oxide or the metal cluster compound in a reactor chamber equipped with a heater; introducing the vapor of the organic linker into the reactor chamber; exposing the precursor structure to the vapor of the organic linker in the reactor chamber; reacting the at least one of the metal oxide or the metal cluster compound in the precursor structure with the organic linker in the reactor chamber at a temperature of about 80° C. to about 100° C. to form the nanoporous structure comprising the metal-organic framework; and exposing the nanoporous structure to a temperature of about 120° C. to about 150° C. and a subatmospheric pressure of about 0.0001 bar to about 0.001 bar to activate the nanoporous structure.

Embodiment 15. The method as in any prior embodiment, wherein the vapor of the organic linker is introduced into the reactor chamber together with a gaseous carrier.

Embodiment 16. The method as in any prior embodiment, wherein the nanoporous structure is discontinuous and has a predetermined pattern.

Embodiment 17. The method as in any prior embodiment, wherein the nanoporous structure has a first portion and a second portion, and the first portion and the second portion have at least one of a different thickness; a different shape; or a different metal-organic framework.

Embodiment 18. The method as in any prior embodiment, further comprising: additively forming a second precursor structure from at least one of a second metal oxide or a second metal cluster compound on the nanoporous structure; exposing the second precursor structure to a vapor of a second organic linker; and reacting the at least one of the second metal oxide or the second metal cluster compound in the second precursor structure with the second organic linker to form a second nanoporous structure comprising a second metal-organic framework disposed on the nanoporous structure; wherein the nanoporous structure and the second nanoporous structure have at least one of a different thickness; a different shape; or a different metal-organic framework.

Embodiment 19. An integrated system for manufacturing a nanoporous structure on a substrate, the integrated system comprising: a reactor chamber equipped with a heater effective to heat the reactor chamber and a substrate disposed in the reactor chamber, the reactor chamber having an inlet for introducing a vapor of an organic linker into the reactor chamber and an outlet for removing a gaseous stream from the reactor chamber; a platform disposed inside the reactor chamber, the platform being effective to support and optionally heat the substrate; and an additive manufacturing apparatus disposed inside the reactor chamber, the additive manufacturing apparatus effective to additively forming a precursor structure on the substrate.

Embodiment 20. The integrated system as in any prior embodiment, wherein the additive manufacturing apparatus is an aerosol jetting apparatus, a binder jetting apparatus, or a material jetting apparatus.

Embodiment 21. The integrated system as in any prior embodiment, wherein the outlet of the reactor chamber is coupled to a pump.

All ranges disclosed herein are inclusive of the endpoints, and the endpoints are independently combinable with each other. As used herein, "combination" is inclusive of blends, mixtures, alloys, reaction products, and the like. All references are incorporated herein by reference in their entirety.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." The modifier "about" used in connection with a quantity is inclusive of the stated value and has the meaning dictated by the context (e.g., it includes the degree of error associated with measurement of the particular quantity).

What is claimed is:

1. An integrated system for manufacturing a nanoporous structure on a substrate, the integrated system comprising:
    a reactor chamber equipped with a chamber heater effective to heat the reactor chamber and a substrate disposed in the reactor chamber, the reactor chamber having an inlet for introducing a vapor of an organic linker into the reactor chamber and an outlet for removing a gaseous stream from the reactor chamber;
    a platform equipped with a platform heater and disposed inside the reactor chamber, the platform being effective to support and heat the substrate, wherein the platform heater is configured to heat the substrate to a temperature that is different from a temperature of the reactor chamber; and
    an additive manufacturing apparatus disposed inside the reactor chamber, the additive manufacturing apparatus effective to additively forming a precursor structure on the substrate,
    wherein the integrated system further comprises a vapor generation system outside of the reactor chamber, and
    the vapor generation system is in fluid communication with the inlet of the reactor chamber, and comprises a vapor generation heater.

2. The integrated system of claim 1, wherein the additive manufacturing apparatus is an aerosol jetting apparatus, a binder jetting apparatus, or a material jetting apparatus.

3. The integrated system of claim 1, wherein the outlet of the reactor chamber is coupled to a pump.

4. The integrated system of claim 1, wherein the platform is equipped with more than one heater to evenly heat the substrate.

5. The integrated system of claim 1, wherein the reactor chamber is equipped with more than one heater mounted on walls of the reactor chamber.

6. The integrated system of claim 1, further comprising the vapor of the organic linker in the reactor chamber.

7. The integrated system of claim 6, wherein the organic linker comprises at least one of a carboxylate or a imidazolate.

8. A method of manufacturing a nanoporous structure on a substrate with the integrated system of claim 1, the method comprising:
    additively forming a precursor structure from at least one of a metal oxide or a metal cluster compound on the substrate;
    exposing the precursor structure to a vapor of an organic linker generated from the vapor generation system and introduced into the reactor chamber via the inlet of the reactor chamber; and
    reacting the at least one of the metal oxide or the metal cluster compound in the precursor structure with the organic linker to form the nanoporous structure comprising a metal-organic framework,
    wherein the additively forming, the exposing, and the reacting occur in the reactor chamber.

9. The method of claim 8, comprising additively forming the precursor structure via an aerosol jetting process, a binder jetting process, or a material jetting process.

10. The method of claim 8, wherein the precursor structure is formed from the metal oxide, and the metal oxide comprises at least one of zinc oxide, aluminum oxide, magnesium oxide, iron oxide, cobalt oxide, nickel oxide, copper oxide, calcium oxide, barium oxide, cerium oxide, manganese oxide, gallium oxide, or cadmium oxide.

11. The method of claim 8, wherein the precursor structure is formed from the metal cluster compound, and the metal cluster compound comprises at least one of a titanium-based cluster compound or a zirconium-based cluster compound.

12. The method of claim 8, wherein the metal oxide and the metal cluster compound have a particle size of about 10 nm to about 100 µm.

13. The method of claim 8, wherein the precursor structure has a thickness of about 10 nm to about 100 microns.

14. The method of claim 8, further comprising depowdering the precursor structure to remove loose particles from the precursor structure before the precursor structure is exposed to the vapor of the organic linker.

15. The method of claim 8, wherein the organic linker comprises at least one of a carboxylate or a imidazolate.

16. The method of claim 8, comprising reacting the at least one of the metal oxide or the metal cluster compound in the precursor structure with the organic linker at a temperature of about 80° C. to about 100° C. to form the nanoporous structure.

17. The method of claim 8, comprising reacting the at least one of the metal oxide or the metal cluster compound in the precursor structure with the organic linker at a pressure of about 0.001 bar to about 1 bar to form the nanoporous structure.

18. The method of claim 8, wherein
    the metal-organic framework is a crystalline network comprising inorganic nodes linked by organic moieties, the inorganic nodes formed from the at least one of the metal oxide or the metal cluster compound, and the organic moieties formed from the organic linker; and
    the crystalline network has voids with a pore diameter of about 5 to about 20 angstroms.

19. The method of claim 8, further comprising exposing the nanoporous structure to a temperature of about 120° C. to about 150° C. at a subatmospheric pressure of about 0.0001 bar to about 0.001 bar to activate the nanoporous structure.

20. The method of claim 8, comprising:
    additively forming the precursor structure on the substrate via an aerosol jetting process, a binder jetting process, or a material jetting process from at least one of the metal oxide or the metal cluster compound in the reactor chamber equipped;
    introducing the vapor of the organic linker into the reactor chamber;
    exposing the precursor structure to the vapor of the organic linker in the reactor chamber;
    reacting the at least one of the metal oxide or the metal cluster compound in the precursor structure with the organic linker in the reactor chamber at a temperature of about 80° C. to about 100° C. to form the nanoporous structure comprising the metal-organic framework; and
    exposing the nanoporous structure to a temperature of about 120° C. to about 150° C. and a subatmospheric pressure of about 0.0001 bar to about 0.001 bar to activate the nanoporous structure.

21. The method of claim 20, wherein the vapor of the organic linker is introduced into the reactor chamber together with a gaseous carrier.

22. The method of claim 8, wherein the nanoporous structure is discontinuous and has a predetermined pattern.

23. The method of claim 8, wherein the nanoporous structure has a first portion and a second portion, and the first portion and the second portion have at least one of a different thickness; a different shape; or a different metal-organic framework.

24. The method of claim 8, further comprising:

additively forming a second precursor structure from at least one of a second metal oxide or a second metal cluster compound on the nanoporous structure;

exposing the second precursor structure to a vapor of a second organic linker; and reacting the at least one of the second metal oxide or the second metal cluster compound in the second precursor structure with the second organic linker to form a second nanoporous structure comprising a second metal-organic framework disposed on the nanoporous structure;

wherein the nanoporous structure and the second nanoporous structure have at least one of a different thickness; a different shape; or a different metal-organic framework.

25. An integrated system for manufacturing a nanoporous structure on a substrate, the integrated system comprising:

a reactor chamber equipped with a chamber heater effective to heat the reactor chamber and a substrate disposed in the reactor chamber, the reactor chamber having an inlet for introducing a vapor of an organic linker into the reactor chamber and an outlet for removing a gaseous stream from the reactor chamber;

a platform equipped with a platform heater and disposed inside the reactor chamber, the platform being effective to support and heat the substrate, wherein the platform heater is configured to heat the substrate to a temperature that is different from a temperature of the reactor chamber; and an additive manufacturing apparatus disposed inside the reactor chamber, the additive manufacturing apparatus effective to additively forming a precursor structure on the substrate, wherein the integrated system further comprises the vapor of the organic linker in the reactor chamber.

* * * * *